United States Patent
Chen et al.

(10) Patent No.: US 6,650,015 B2
(45) Date of Patent: Nov. 18, 2003

(54) CAVITY-DOWN BALL GRID ARRAY PACKAGE WITH SEMICONDUCTOR CHIP SOLDER BALL

(75) Inventors: Eing-Chieh Chen, Taichung (TW); Shiu-Tai Tzung, Taichung (TW); Ting-Ke Chai, Taichung (TW); Jeng-Yuan Lai, Taichung (TW); Candy Tien, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 10/173,213

(22) Filed: Jun. 14, 2002

(65) Prior Publication Data

US 2003/0146508 A1 Aug. 7, 2003

(30) Foreign Application Priority Data

Feb. 5, 2002 (TW) .......................... 91101949 A

(51) Int. Cl.[7] .............................. H01L 23/48
(52) U.S. Cl. .................. 257/738; 257/678; 257/778; 257/776
(58) Field of Search .................. 257/678, 687, 257/738, 778, 776

(56) References Cited

U.S. PATENT DOCUMENTS

| | | | | |
|---|---|---|---|---|
| 5,397,921 | A | 3/1995 | Karnezos | 257/779 |
| 5,409,865 | A | 4/1995 | Karnezos | 437/210 |
| 5,646,828 | A | * 7/1997 | Degani et al. | 361/715 |
| 6,163,458 | A | 12/2000 | Li | 361/704 |
| 6,287,893 | B1 | * 9/2001 | Elenius et al. | 438/108 |

OTHER PUBLICATIONS

Harper, Electronic Packaging and Interconnection Handbook, 1991, McGrawHill, pp. 6.71–6.73.*
Wolf, Silicon Processing for the VLSI Era, 2000, Latice Press, vol. 1, pp. 857–860.*

* cited by examiner

Primary Examiner—Nathan J. Flynn
Assistant Examiner—Leonardo Andújar
(74) Attorney, Agent, or Firm—Mikio Ishimaru

(57) ABSTRACT

A cavity-down ball grid array package includes a substrate having a through cavity provided therein. A heat sink is attached to the substrate and a semiconductor chip in the cavity is attached to the heat sink and electrically connected to the substrate. A ball grid array is on the substrate and on the semiconductor chip.

10 Claims, 3 Drawing Sheets

CAVITY-DOWN BALL GRID ARRAY PACKAGE WITH SEMICONDUCTOR CHIP SOLDER BALL

BACKGROUND OF THE INVENTION

1. Field of the Invention

This invention relates to integrated circuit packaging technology, and more particularly, to CDBGA (Cavity-Down Ball Grid Array) packages.

2. Description of Related Art

The BGA (Ball Grid Array) package is an advanced type of integrated circuit packaging technology, which is characterized by the use of a substrate as a chip carrier in which a top surface is used for mounting one or more semiconductor chips and a bottom surface carries an array of solder balls (i.e., a ball grid array). During mounting using SMT (Surface Mount Technology) processes, the BGA package can be mechanically bonded and electrically coupled to an external printed circuit board (PCB) by means of the solder balls.

The CDBGA (Cavity-Down Ball Grid Array) package is a special type of BGA technology in which the packaged semiconductor chip is mounted in an upside-down manner within a downward-facing cavity in the substrate. As the CDBGA package has come into use, semiconductor chips have become smaller and have come to operate at substantially higher speeds generating large amounts of heat. The heat must be dissipated from the semiconductor chip and this requires heat sinks attached to the semiconductor chip.

One problem of the CDBGA, however, is that the process of attaching a heat sink on the active surface of the semiconductor chip often breaks the integrated circuit. Still another problem is that the heat sink comes in contact only with a localized point on the semiconductor chip rather than having an evenly distributed contact over the active surface of the packaged semiconductor chip. As a result of the point contact, the heat-dissipation efficiency is low.

A solution which eliminates these problems has been long sought but has equally as long has eluded those having skill in the art.

SUMMARY OF THE INVENTION

A cavity-down ball grid array (CDGBA) package includes a substrate having a through cavity provided therein. A heat sink is attached to the substrate and a semiconductor chip in the cavity is attached to the heat sink and electrically connected to the substrate. A ball grid array is on the substrate and on the semiconductor chip. By having a portion of the ball grid array on the semiconductor chip, increased heat-dissipation efficiency is achieved by dissipating heat from the active surface of the packaged semiconductor chip. This also increases the wire-bonding routability on the packaged semiconductor chip by allowing the bonding wires connected to the packaged semiconductor chip to be spaced at larger intervals to help reduce the capacitive effect and thereby improve the electrical performance of the packaged semiconductor chip.

The above and additional advantages of the present invention will become apparent to those skilled in the art from a reading of the following detailed description when taken in conjunction with the accompanying drawings.

DETAILED DESCRIPTION OF PREFERRED EMBODIMENTS

Figure 1A:
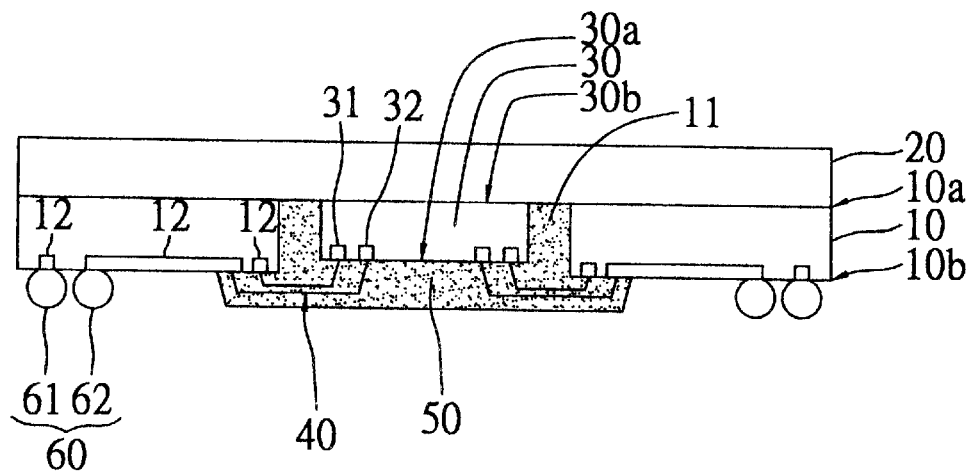
FIG. 1A (PRIOR ART) is a schematic sectional diagram showing a conventional cavity-down ball grid array (CDBGA) package.
Figure 1B:
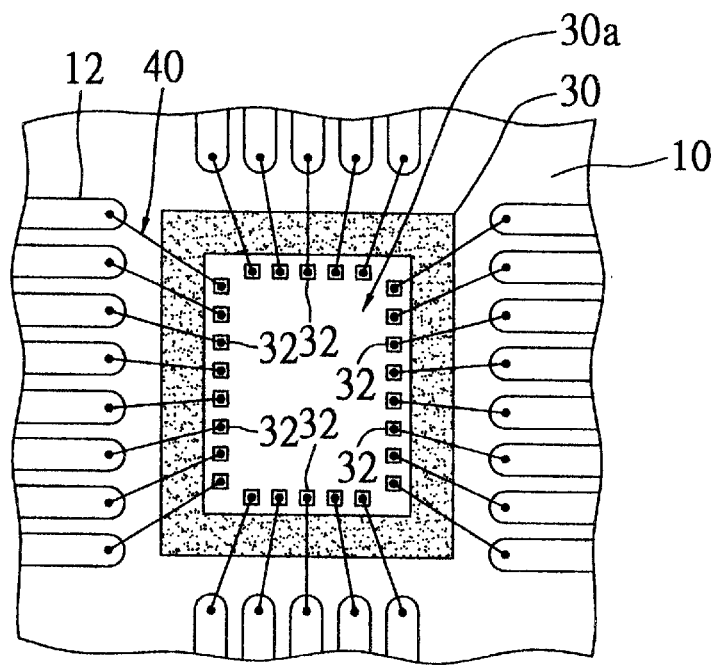
FIG. 1B (PRIOR ART) is a schematic diagram showing a cut-away bottom view of a is portion of the prior art CDBGA package of FIG. 1A (PRIOR ART)

Referring now to FIGS. 1A–1B (PRIOR ART), therein is shown a conventional cavity-down ball grid array (CDBGA) package of: a substrate 10; a heat sink 20; at least one semiconductor chip 30; a set of bonding wires 40; an encapsulation body 50; and a ball grid array 60.

The term "horizontal" as used in herein is defined as a plane parallel to the conventional plane or surface of the substrate 10 regardless of the orientation of the substrate. The term "vertical" refers to a direction perpendicular to the horizontal as just defined. Terms, such as "top","bottom", "up","down","over", and "under", are defined with respect to the horizontal plane.

The substrate 10 has a non-circuited top surface 10a with no electrically-conductive traces and a circuited bottom surface 10b with a plurality of electrically-conductive traces 12. The substrate 10 is formed with a centrally-located cavity 11. When the heat sink 20 is placed over the substrate 10, the centrally-located cavity 11 forms what those having ordinary skill in the art define as a "cavity down" configuration.

The heat sink 20 is made of a thermally-conductive material, such as copper, and is attached to the top surface 10a of the substrate 10. The semiconductor chip 30 has an active bottom surface 30a and an inactive top surface 30b. The active bottom surface 30a is formed with an array of connecting pads, including a plurality of input/output (I/O) pads 31 and a plurality of power/ground pads 32. The connecting pads connect to integrated circuits inside the semiconductor chip 30.

During the assembly process, the semiconductor chip 30 is temporarily turned upside down and the semiconductor chip 30 is mounted within the cavity 11 in the substrate 10 in such a manner that its inactive top surface 30b is attached to the heat sink 20.

Next, a wire-bonding process is performed. The process electrically connects the bonding wires 40 between the plurality of I/O pads 31 and the plurality of power/ground pads 32 on the active bottom surface 30a of the semiconductor chip 30 and the plurality of electrically-conductive traces 12 on the circuited bottom surface 10b of the substrate 10.

After the wire-bonding process, the semiconductor chip 30 is turned top side up and an encapsulation process is performed to form an encapsulation body 50 for encapsulating the semiconductor chip 30 and the bonding wires 40.

Finally, a ball deposition process is performed to deposit a ball grid array 60, including a plurality of I/O solder balls 61 and a plurality of power/ground solder balls 62, which are electrically connected to the electrically-conductive traces 12 on the circuited bottom surface 10b of the substrate 10. This completes the fabrication of the prior art CDBGA package, which is shown top side up in the position in which it is ball-bonded to the PCB.

It can be seen from FIG. 1A that, when the prior art CDBGA package is mounted on a printed circuit board or PCB (not shown), power can be supplied to the semiconductor chip 30 by way of the plurality of power/ground solder balls 62, the electrically-conductive traces 12, and the bonding wires 40 to the plurality of power/ground pads 32 on the active surface 30a of the semiconductor chip 30. Similarly, I/O signals can be transmitted over the plurality of I/O solder balls 61, the electrically-conductive traces 12, the bonding wires 40, and the plurality of I/O pads 31 on the active bottom surface 30a of the semiconductor chip 30.

However, the prior art CDBGA package of FIGS. 1A–1B (PRIOR ART), has a number of problems.

First, since the plurality of I/O pads 31 and the plurality of power/ground pads 32 are arranged in line at very small intervals along the periphery of the active bottom surface 30a of the semiconductor chip 30, the routability of the bonding wires 40 is very low. In addition, the densely-arranged bonding wires 40 large capacitive effects that the I/O signals being transmitted over the bonding wires 40 and degrade the performance of the semiconductor chip 30.

Second, since the heat produced by the semiconductor chip 30 during operation is mostly from the active bottom surface 30a rather than the inactive top surface 30b, the attachment of the heat sink 20 to the inactive surface 30b provides poor heat-dissipation efficiency, which can lead to failure of the semiconductor chip 30.

Figure 2A:
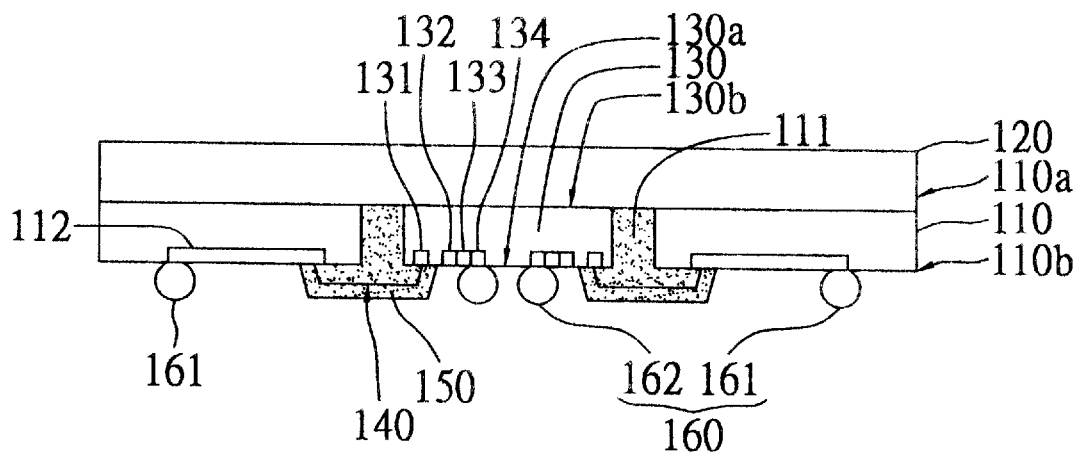
FIG. 2A is a schematic diagram showing a sectional view of an embodiment of the CDBGA package according to the invention.
Figure 2B:
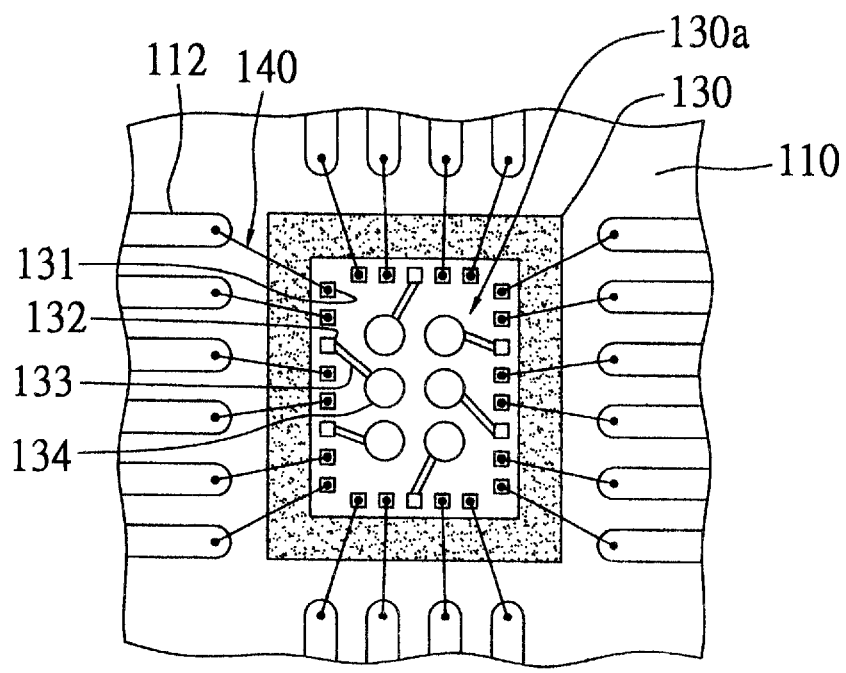
FIG. 2B is a schematic diagram showing a cut-away bottom view of a portion of the CDBGA package of FIG. 2A.

Referring now to FIG. 2A and FIG. 2B, therein is shown a preferred embodiment of a CDBGA package comprising: a substrate 110; a heat sink 120; at least one semiconductor chip 130; a set of bonding wires 140; an encapsulation body 150; and a ball grid array 160.

The substrate 110 has a non-circuited top surface 110a and a circuited bottom surface 110b. The circuited bottom surface 110b is formed with a plurality of electrically-conductive traces 112. The substrate 110 is formed with a cavity 111 in the center thereof.

The heat sink 120 is made of a thermally-conductive material, such as copper, and is attached to the non-circuited top surface 110a of the substrate 110. The semiconductor chip 130 has an active bottom surface 130a and an inactive top surface 130b. The active bottom surface 130a is formed with an array of connecting pads, including a plurality of I/O pads 131 and a plurality of power/ground pads 132. The active bottom surface 130a of the semiconductor chip 130 is further provided with a plurality of RDL (Redistribution Layer) lines 133 and a plurality of solder-ball pads 134 connected respectively by the RDL lines 133 to the plurality of power/ground pads 132. The plurality of solder-ball pads 134 are shown within the plurality of power/ground pads 132, but the present invention is not limited to this placement. The connecting pads connect to integrated circuits inside the semiconductor chip 130.

During the assembly process, the semiconductor chip 30 is temporarily turned upside down and the semiconductor chip 130 is mounted within the cavity 111 in the substrate 110 with its inactive top surface 130b is attached to the heat sink 120.

Next, a wire-bonding process is performed. The process electrically connects the bonding wires 140 between the plurality of I/O pads 131 on the active bottom surface 130a of the semiconductor chip 130 and the plurality of electrically-conductive traces 112 on the circuited bottom surface 110b of the substrate 110. It should be noted that the bonding wires for electrically connecting the plurality of power/ground pads 132 and the plurality of electrically-conductive traces 112 are not required with the present invention.

After the wire-bonding process, the semiconductor chip 130 is turned top side up and an encapsulation process is performed to form the encapsulation body 150, which encapsulates part of the semiconductor chip 130 and the whole of the bonding wires 140 while exposing the solder-ball pads 134 in the center of the active bottom surface 130a of the semiconductor chip 130.

Finally, a ball deposition process is performed to deposit a ball grid array 160, including a plurality of I/O solder balls 161 and a plurality of power/ground solder balls 162. The plurality of I/O solder balls 161 are electrically connected to the electrically-conductive traces 112 on the circuited bottom surface 110b of the substrate 110, while the plurality of power/ground solder balls 162 are electrically connected to the exposed solder-ball pads 134 in the center of the active bottom surface 130a of the semiconductor chip 130. This completes the fabrication of the CDBGA package, which is shown top side up in the position in which it is ball-bonded to the PCB.

It can be seen from FIG. 2A that, when the finished CDBGA package is mounted on a PCB (not shown), power can be supplied to the semiconductor chip 130 by way of the power/ground solder balls 162, the solder-ball pads 134, and the RDL lines 133 to the power/ground pads 132 on the active surface 130a of the semiconductor chip 130. The I/O signals can be transmitted over the plurality of I/O solder balls 161, the electrically-conductive traces 112, the bonding wires 140, and the plurality of I/O pads 131 on the active surface 130a of the semiconductor chip 130. The connecting pads connect to integrated circuits inside the semiconductor chip 230.

During operation, the heat produced by the semiconductor chip 130 can be dissipated by way of the heat sink 120 to the top outside, and the heat from the active surface 130a of the semiconductor chip 130 can be dissipated directly by way of the power/ground solder balls 162 on the active surface 130a of the semiconductor chip 130 to external heat-dissipation means (not shown) of the PCB. In other words, the power/ground solder balls 162, in addition to serving as power/ground connecting means, also serve as heat-dissipation means to the CDBGA package to thereby thermally enhance the CDBGA package.

Moreover, since the plurality of power/ground pads 132 are centrally-redistributed to the plurality of solder-ball pads 134 in the center of the active surface 130a of the semiconductor chip 130, it allows the bonding wires 140 just to be connected to the plurality of I/O pads 131 without having to be connected to the plurality of power/ground pads 132, thereby allowing a higher degree of routability to the wire-bonding process as well as allowing the bonding wires 140 to be spaced at larger intervals to help reduce the undesired capacitive effect between the bonding wires 140.

Figure 3A:
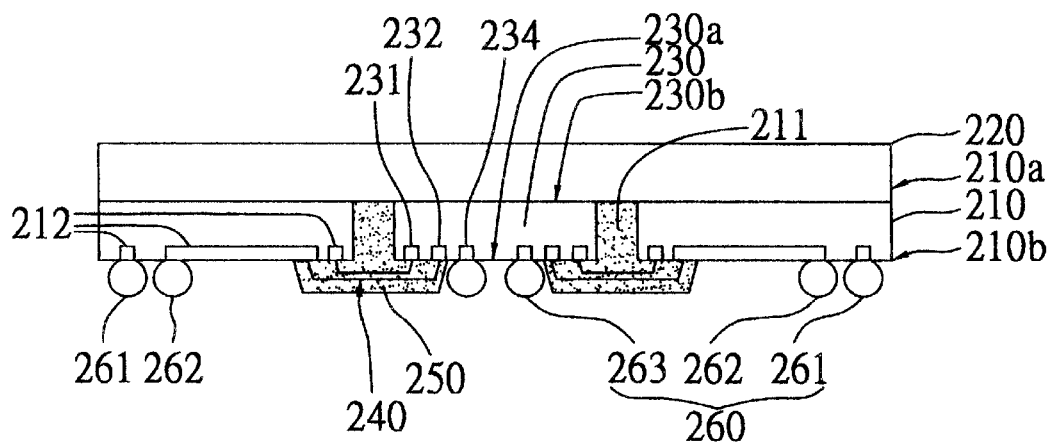
FIG. 3A is a schematic diagram showing a sectional view of a alternative embodiment of the CDBGA package according to the invention.
Figure 3B:
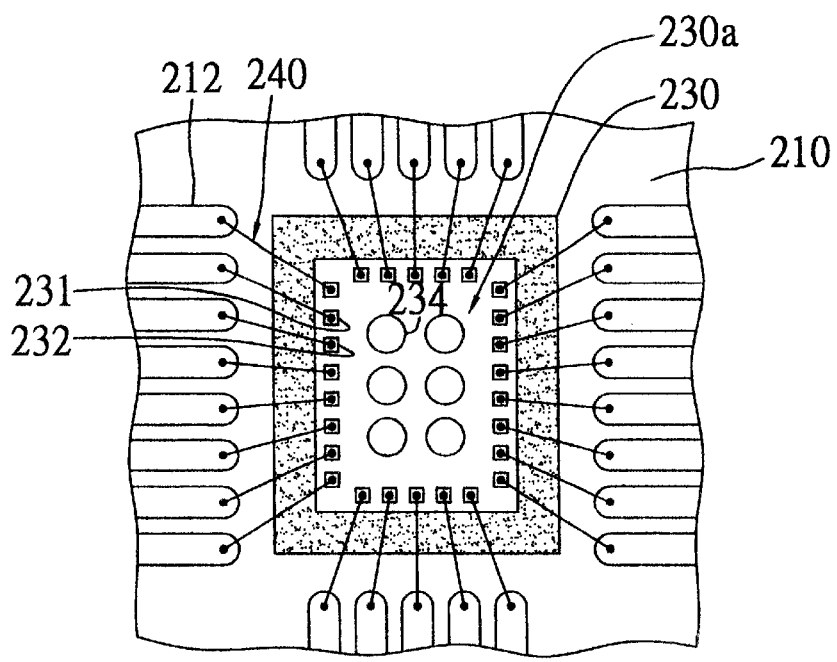
FIG. 3B is a schematic diagram showing a cut-away bottom view of a portion of the CDBGA package of FIG. 3A.

Referring now to FIG. 3A and FIG. 3B, therein is shown an alternative preferred embodiment of a CDBGA comprising: a substrate 210; a heat sink 220; at least one semiconductor chip 230; a set of bonding wires 240; an encapsulation body 250; and a ball grid array 260.

The substrate 210 has a non-circuited top surface 210a and a circuited bottom surface 210b. The circuited bottom surface 210b is formed with a plurality of electrically-conductive traces 212. The substrate 210 is formed with a cavity 211 in the center thereof.

The heat sink 220 is made of a thermally-conductive material, such as copper, and is attached to the non-circuited top surface 210a of the substrate 210. The semiconductor chip 230 has an active bottom surface 230a and an inactive top surface 230b. The active bottom surface 230a is formed with an array of connecting pads, including a plurality of I/O pads 231 and a plurality of power/ground pads 232.

The active bottom surface 230a of the semiconductor chip 230 is further provided with a plurality of centrally-located dummy pads 234, which are unconnected to the power/ground pads 232. The dummy pads 234 can be formed by, for example, the well-known UBM (Under Bump Metallization) technology.

During the assembly process, the semiconductor chip 230 is temporarily turned upside down and is mounted within the cavity 211 in the substrate 210 with its inactive top surface 230b attached to the heat sink 220.

Next, a wire-bonding process is performed. The process electrically connects the bonding wires 240 between the plurality of I/O pads 231 and the plurality of power/ground pads 232 and the plurality of electrically-conductive traces 212 on the bottom surface 210b of the substrate 210.

After the wire-bonding process, the semiconductor chip 230 is turned top side up and an encapsulation process is performed to form the encapsulation body 250, which encapsulates part of the semiconductor chip 230 and the whole of the bonding wires 240 while exposing the dummy pads 234 in the center of the active surface 230a of the semiconductor chip 230.

Finally, a ball deposition process is performed to deposit a ball grid array 260, including a plurality of I/O solder balls 261, a plurality of power/ground solder balls 262, and a plurality of heat-dissipation solder balls 263. The I/O solder balls 261 and the power/ground solder balls 262 are electrically connected to corresponding electrically-conductive traces 212 on the bottom surface 210b of the substrate 210, while the heat-dissipation solder balls 263 are electrically connected to the exposed dummy pads 234 in the center of the active surface 230a of the semiconductor chip 230. This completes the fabrication of the CDBGA package, which is shown top side up in the position in which it is ball-bonded to the PCB.

It can be seen from FIG. 3A that when the finished CDBGA package is mounted on a PCB (not shown), power can be supplied to the semiconductor chip 230 by way of the power/ground solder balls 262, the electrically-conductive traces 212, and the bonding wires 240 to the power/ground pads 232 on the active surface 230a of the semiconductor chip 230; while I/O signals can be transmitted over the I/O solder balls 261, the electrically-conductive traces 212, the bonding wires 240, and the I/O pads 231 on the active surface 230a of the semiconductor chip 230.

During operation, the heat produced by the semiconductor chip 230 can be dissipated by way of the heat sink 220 to the top outside, and the heat from the active surface 230a of the semiconductor chip 230 can be dissipated directly by way of the dummy pads 234 and the heat-dissipation solder balls 263 in the center of on the active surface 230a of the semiconductor chip 230 to external heat-dissipation means (not shown) of the PCB. Since these heat-dissipation solder balls 263 are provided on the active surface 230a of the semiconductor chip 230, it can help thermally enhance the CDBGA package as compared to the prior art shown in FIGS. 1A–1B (PRIOR ART).

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

The invention claimed is:

1. A cavity-down ball grid army package comprising:
    a substrate having a through cavity provided therein;
    a heat sink attached to the substrate;
    a semiconductor chip in the cavity attached to the heat sink and electrically connected to the substrate; and
    a ball grid array on the substrate and on the semiconductor chip;
    bonding wires electrically connecting the semiconductor chip to the substrate; and
    an encapsulation body encapsulating the bonding wires and exposing a portion of the semiconductor chip for a portion of the ball grid array to be on the semiconductor chip.

2. The cavity-down ball grid array package as claimed in claim 1 wherein:
    the ball grid array includes a solder ball; and
    the semiconductor chip includes a pad for attaching a solder ball.

3. The cavity-down ball grid array package as claimed in claim 1 wherein:
    the ball grid array includes a solder ball; and
    the semiconductor chip includes:
        an integrated circuit;
        a first pad connected to the integrated circuit;
        a second pad for attaching the solder ball; and
        an electrical connection between the first and second pads.

4. The cavity-down ball grid array package as claimed in claim 1 wherein:
    the ball grid array includes solder balls; and
    the semiconductor chip includes:
        an integrated circuit having power and ground connections;
        power and ground pads connected to the power and ground connections;
        pads for attaching solder balls; and
        redistribution layer lines between the power and ground pads and the pads for attaching the solder balls.

5. The cavity-down ball grid array package as claimed in claim 1 wherein:
    the ball grid array includes a solder ball; and
    the semiconductor chip includes a pad for Attaching a solder ball, the pad formed through an under bump metallurgy technology.

6. A cavity-down ball grid array package comprising:
    a substrate having a top surface and a bottom surface and formed with a cavity; the substrate further including a plurality of electrically-conductive traces on the bottom surface thereof;
    a heat sink attached to the top surface of the substrate;
    a semiconductor chip having an active surface and an inactive surface, the active surface is formed with a plurality of input/output pads and a plurality of power/ground pads, the semiconductor chip being mounted within the cavity in the substrate with the inactive surface thereof being attached to the heat sink;

a set of bonding wires for electrically connecting the input/output pads to corresponding electrically-conductive traces on the bottom surface of the substrate;

a ball grid array, including a plurality of heat-dissipation solder balls which are deposited on the active surface of the semiconductor chip;

an encapsulation body for encapsulating part of the semiconductor chip while exposing the active surface of the semiconductor chip.

7. The cavity-down ball grid array package of claim 6, wherein the heat-dissipation solder balls are power/ground solder balls which are electrically connected by redistribution layer lines to the power/ground pads on the active surface of the semiconductor chip.

8. The cavity-down ball grid array package of claim 7, wherein the beat-dissipation solder balls are deposited on a plurality of dummy pads formed on the active surface of the semiconductor chip.

9. A cavity-down ball grid array package comprising:

a substrate having a top surface and a bottom surface and formed with a centrally-located cavity, the substrate further including a plurality of electrically-conductive traces on the bottom surface thereof;

a heat sink attached to the top surface of the substrate;

at least one semiconductor chip having an active surface and an inactive surface, and the active surface is formed with a plurality of input/output pads and a plurality of power/ground pads, and further formed with a plurality of solder-ball pads connected respectively by a plurality of redistribution layer lines to the power/ground pads, the semiconductor chip being mounted within the cavity in the substrate with the inactive surface thereof being attached to the heat sink;

a set of bonding wires for electrically connecting the input/output pads to corresponding electrically-conductive traces on the bottom surface of the substrate;

an encapsulation body for encapsulating part of the semiconductor chip while exposing the solder-ball pads on the active surface of the semiconductor chip; and a ball grid array, including a plurality of input/output solder balls and a plurality of power/ground solder balls; wherein the input/output solder balls are electrically connected to corresponding electrically-conductive traces on the bottom surface of the substrate, while the power/ground solder balls are electrically connected to the solder-ball pads on the exposed active surface of the semiconductor chip.

10. A cavity-down ball grid array package comprising:

a substrate having a top surface and a bottom surface and formed with a centrally-located cavity, the substrate further including a plurality of electrically-conductive traces on the bottom surface thereof;

a heat sink attached to the top surface of the substrate;

at least one semiconductor chip having an active surface and an inactive surface, and the active surface is formed with a plurality of input/output pads and a plurality of power/ground pads, and further formed with a plurality of centrally-located dummy pads, the semiconductor chip being mounted within the cavity in the substrate with the inactive surface thereof being attached to the heat sink;

a set of bonding wires for electrically connecting the input/output pads and the power/ground pads to corresponding electrically-conductive traces on the bottom surface of the substrate;

an encapsulation body for encapsulating part of the semiconductor chip while exposing the dummy pads on the active surface of the semiconductor chip; and a ball grid array, including a plurality of input/output solder balls, a plurality of power/ground solder balls, and a plurality of heat-dissipation solder balls, wherein the input/output solder balls and the power/ground solder balls are electrically connected to corresponding electrically-conductive traces on the bottom surface of the substrate, while the heat-dissipation solder balls are electrically connected to the dummy pads on the active surface of the semiconductor chip.

* * * * *

UNITED STATES PATENT AND TRADEMARK OFFICE
CERTIFICATE OF CORRECTION

PATENT NO.    : 6,650,015 B2                                              Page 1 of 1
DATED         : November 18, 2003
INVENTOR(S)   : Chen et al.

It is certified that error appears in the above-identified patent and that said Letters Patent is hereby corrected as shown below:

Column 2,
Line 2, delete "is"

Column 6,
Line 10, delete "army" and insert -- array --

Column 7,
Line 17, delete "beat" and insert -- heat --

Signed and Sealed this

Twenty-third Day of December, 2003

JAMES E. ROGAN
*Director of the United States Patent and Trademark Office*